(12) United States Patent
Sano et al.

(10) Patent No.: US 7,537,481 B2
(45) Date of Patent: May 26, 2009

(54) ELECTRICAL JUNCTION BOX FOR MOTOR VEHICLE

(75) Inventors: Takayuki Sano, Yokkaichi (JP); Tatsuya Hayakawa, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 0 days.

(21) Appl. No.: 12/155,380

(22) Filed: Jun. 3, 2008

(65) Prior Publication Data

US 2009/0017648 A1    Jan. 15, 2009

(30) Foreign Application Priority Data

Jul. 10, 2007    (JP)   ............... 2007-180886

(51) Int. Cl.
*H01R 13/60*    (2006.01)

(52) U.S. Cl. .................................. 439/527

(58) Field of Classification Search ............. 439/76.2, 439/527, 574, 575, 174, 949
See application file for complete search history.

(56) References Cited

U.S. PATENT DOCUMENTS

| | | | | |
|---|---|---|---|---|
| 5,501,614 A | * | 3/1996 | Tsuchiya | 439/574 |
| 5,801,335 A | * | 9/1998 | Brussalis et al. | 174/138 G |
| 5,868,583 A | * | 2/1999 | Naitou et al. | 439/76.2 |
| 5,897,385 A | * | 4/1999 | Kasai | 439/76.2 |
| 6,095,828 A | * | 8/2000 | Burland | 439/98 |
| 6,206,726 B1 | | 3/2001 | Takahashi et al. | |
| 6,227,906 B1 | * | 5/2001 | Fan | 439/570 |
| 6,254,429 B1 | * | 7/2001 | Morita | 439/570 |
| 6,264,510 B1 | * | 7/2001 | Onizuka et al. | 439/876 |
| 6,579,123 B2 | * | 6/2003 | Kasahara | 439/573 |
| 6,786,740 B2 | * | 9/2004 | Ito | 439/76.2 |
| 6,875,052 B1 | * | 4/2005 | Lo et al. | 439/564 |
| 6,971,911 B2 | * | 12/2005 | Ramsey et al. | 439/574 |
| 7,004,798 B2 | * | 2/2006 | Yuasa et al. | 439/874 |
| 2005/0118843 A1 | | 6/2005 | Koyama | |

FOREIGN PATENT DOCUMENTS

| JP | A-09-103018 | 4/1997 |
|---|---|---|
| JP | A-10-084614 | 3/1998 |

\* cited by examiner

*Primary Examiner*—T C Patel
*Assistant Examiner*—Harshad C Patel
(74) *Attorney, Agent, or Firm*—Oliff & Berridge, PLC (57) ABSTRACT

An electrical junction box for a motor vehicle, the electrical junction box including a casing assembly, a bracket section and a bracket. The bracket section is integrated with and projected from an exterior of the casing assembly. The bracket section includes a top wall provided with a clip-engaging hole and opposite side walls extending downward from the top wall and that have clamping-piece portions that are opposed to each other at a distal end of the opposite side walls. The bracket is fitted on and secured to an exterior of the bracket section. The bracket includes a top plate portion provided with a clip-engaging hole and an outer plate portion extending downward from the top plate portion and that has an engaging-piece portion.

13 Claims, 7 Drawing Sheets

ELECTRICAL JUNCTION BOX FOR MOTOR VEHICLE

CROSS-REFERENCE TO RELATED APPLICATION

This application claims priority from Japanese Patent Application No. 2007-180886 filed on Jul.10, 2007, the entire disclosure of which is incorporated herein by reference.

BACKGROUND

The present invention relates to an electrical junction box for a motor vehicle.

Figure 8:
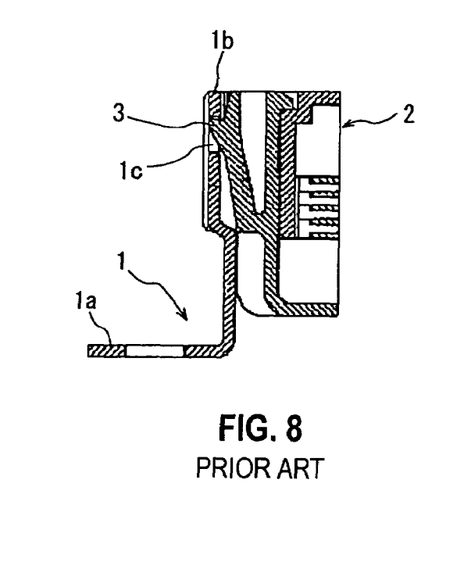
FIG. 8 is a sectional view of a structure for attaching a prior art electrical junction box to a motor vehicle panel.

There exists a structure for attaching an electrical junction box to a vehicle body as shown in JP-A-1997-103018, which is illustrated by the enclosed FIG. 8. The attaching structure for securing the electrical junction box 2 to a vehicle body panel (not shown) is an L-shaped metal bracket 1. Specifically, an end 1a of the metal bracket 1 is fixed to the vehicle body panel by a bolt while an engaging pawl 3, which is provided on an exterior of a casing assembly of the electrical junction box 2, is engaged with an engaging hole 1c formed in the other end 1b of the metal bracket 1.

SUMMARY

However, the metal bracket 1 of JP-A-1997-103018 must be extended from a fixing position on the vehicle body to an engaging position with the electrical junction box. Consequently, the metal bracket 1 is elongated. In this respect, there is room for improving the cost.

Furthermore, the metal bracket 1 is elongated. Consequently, a dimension between the vehicle body panel and the electrical junction box becomes unstable. In this respect, there is room for improvement.

Furthermore, there is a space between the engaging pawl 3 on the side of the electrical junction box 2 and the engaging hole 1c in the metal bracket 1. Consequently, the spacing will cause rattling. In this respect, there is room for improvement.

In view of the above problems, an object of the embodiments of the present invention is to downsize the attaching structure for fixing the electrical junction box to the vehicle body to lower the cost and prevent the electrical junction box from rattling.

In order to overcome the above problems, the embodiments of the present invention include an electrical junction box for a motor vehicle, the electrical junction box includes a casing assembly, a bracket section and a bracket.

The bracket section is integrated with and projected from an exterior of the casing assembly. The bracket section includes a top wall provided with a clip-engaging hole, and opposite side walls extending downward from the top wall and that have clamping-piece portions that are opposed to each other.

The bracket is fitted on and secured to an exterior of the bracket section. The bracket includes a top plate portion provided with a clip-engaging hole and an outer plate portion extending downward from the top plate portion and that has an engaging-piece portion.

The engaging-piece portion of the bracket clamps to the opposed clamping-piece portions of the bracket section and secures the bracket to the bracket section such that the clip-engaging hole of the bracket section and the clip engaging hole of the bracket align with one another.

An engaging-clip is inserted into and engaged with the clip-engaging holes aligned with each other in the bracket section and the bracket.

According to the above structure of the electrical junction box, the bracket is fitted on and secured to the exterior of the bracket section projected from the lower casing of the electrical junction box and the clip is engaged with the bracket section and bracket to secure the electrical junction box to the vehicle body. Consequently, it is not necessary to extend the bracket from the fixing position on the trim cover of the vehicle body to the engaging position on the electrical junction box, thereby downsizing the bracket and lowering a cost. In addition, since the bracket is not long, a dimension between the trim cover of the vehicle body and the electrical junction box becomes stable.

Although, the prior art demonstrates that the engaging pawl provided on the electrical junction box is engaged with the engaging hole in the metal bracket, in the present invention, the bracket is fitted on the exterior of the bracket section and the electrical junction box is fixed through the clip on the trim cover of the vehicle body without locking and fixing the electrical junction box on the bracket attached to the vehicle body. Therefore, it is possible to secure the electrical junction box to the trim cover of the vehicle body without rattling.

Furthermore, since the bracket is fitted on and secured to the exterior of the bracket section, it is possible to enhance the strength of the bracket section and to prevent the electrical junction box from falling down and out of the vehicle body due to breakage of the bracket section.

Preferably, pushing projections are provided on the opposite side end surfaces of the engaging-piece portion of the bracket to press the clamping-piece portions of the bracket section. The opposite side walls of the bracket section include first and second positioning projections and the first positioning projection is longer than the second positioning projection. The opposite side plate portions of the bracket include positioning grooves and the positioning grooves of the bracket guide the first and second positioning projections of the bracket section to help align and securely fix the bracket to the bracket section.

According to the above construction, it is possible to prevent the bracket from shifting with respect to the bracket section or falling down from the section. Thus, when the clip is engaged with the bracket and bracket section, the clip-engaging holes in the bracket and bracket section are communicated with each other and they are not shifted from each other, thereby facilitating clip insertion and a working engagement.

Preferably, the bracket section is provided on an upper casing or a lower casing of the casing assembly of the electrical junction box; and a printed board is attached to the upper casing or the lower casing, whichever does not provide for the bracket section.

According to the above structure, since the printed boards are not fixed on the casing that includes the bracket section to be secured to the vehicle body, a load applied to the bracket section does not act directly to the printed boards, and it is possible to prevent strain on the printed boards.

As described above, according to the present invention, the bracket is fitted on and secured to the exterior of the bracket section projected from the lower casing of the electrical junction box and the clip attached to the trim cover of the vehicle body is engaged with the bracket section and bracket to secure the electrical junction box to the vehicle body. Consequently, it is possible to downsize the bracket and to lower the cost. In addition, since the bracket does not become elongated, the dimension between the trim cover of the vehicle body and the electrical junction box becomes stable.

Furthermore, since the bracket is fitted on the exterior of the bracket section and the electrical junction box is fixed through the clip on the trim cover of the vehicle body, it is possible to secure the electrical junction box to the trim cover of the vehicle body without rattling.

BRIEF DESCRIPTION OF THE DRAWINGS

Exemplary embodiments will be described below with reference to the drawings, wherein.

DETAILED DESCRIPTION OF EMBODIMENTS

Embodiments of an electrical junction box for a motor vehicle in accordance with the present invention will be described below by referring to the drawings.

FIGS. 1 to 6 show a first embodiment of an electrical junction box

Figure 1:
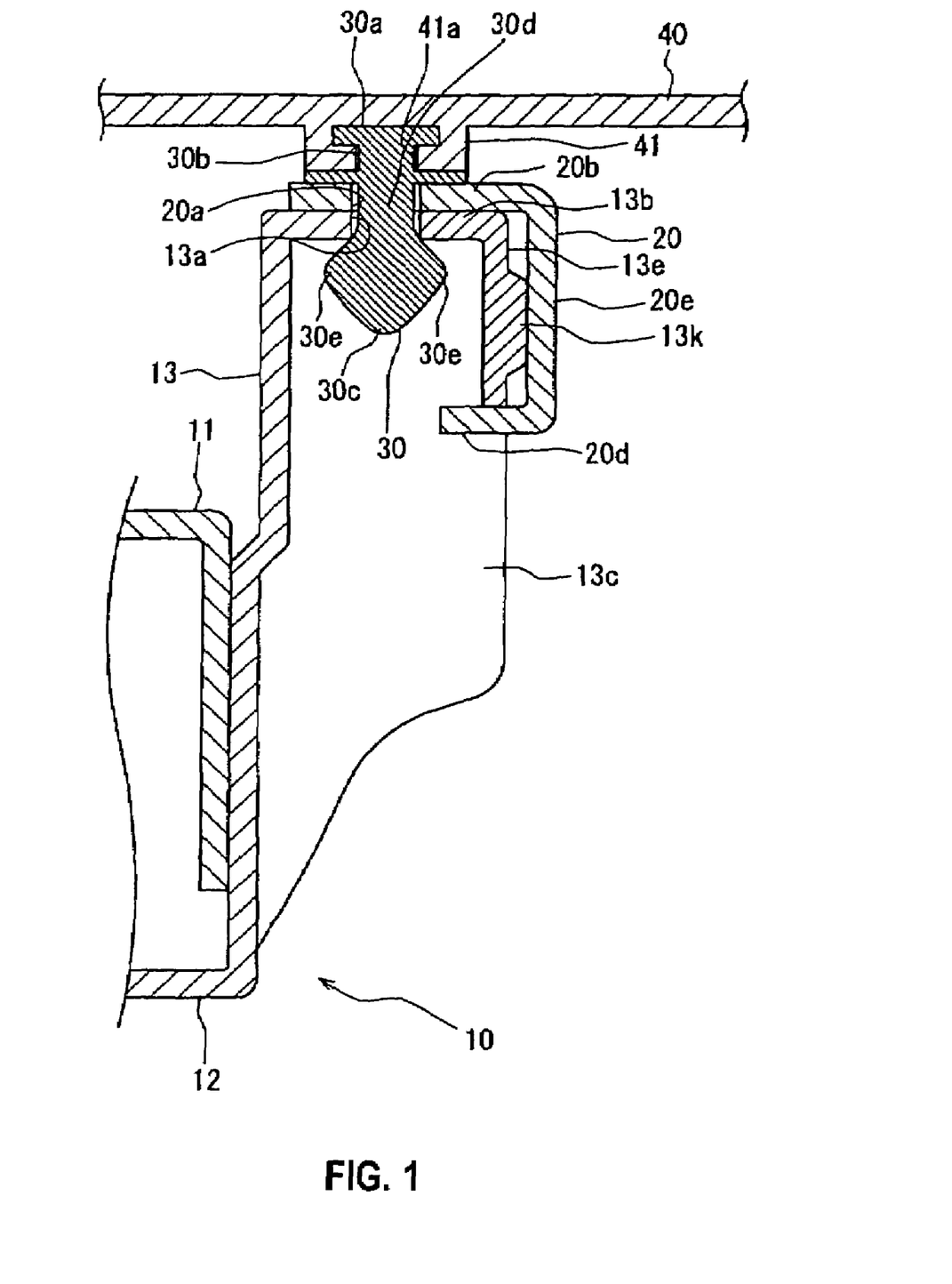
FIG. 1 is an enlarged section view of a first embodiment of a main part of an electrical junction box for a motor vehicle.
Figure 2:
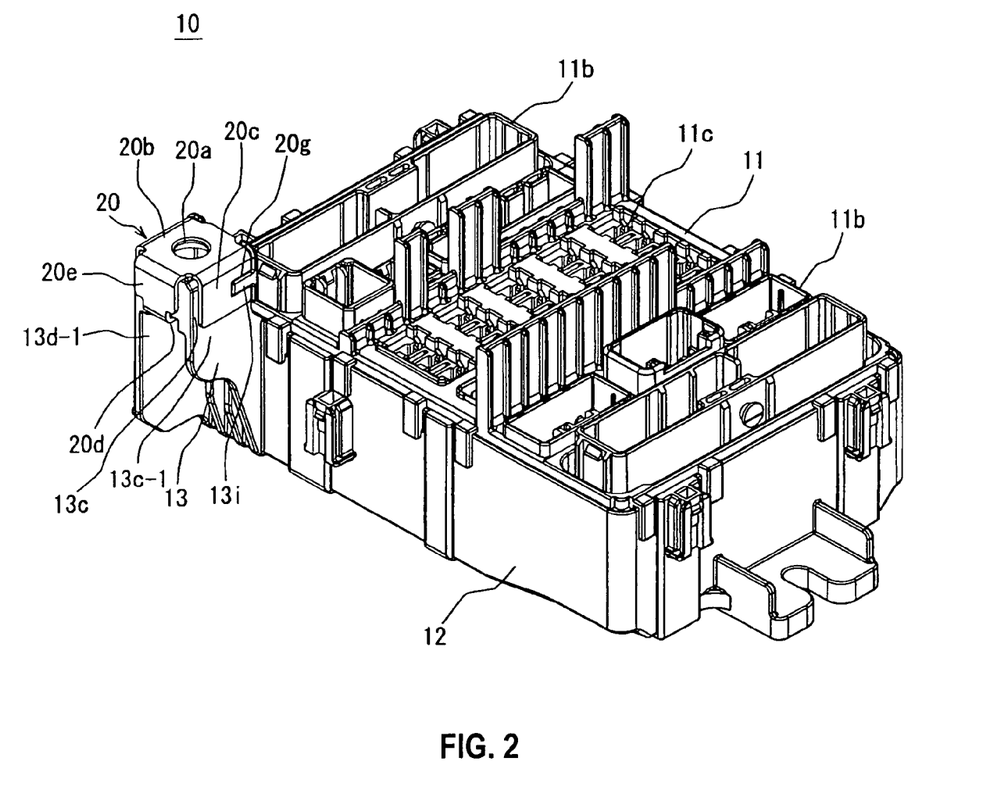
FIG. 2 is a perspective view of an electrical junction box for a motor vehicle.
Figure 3A:
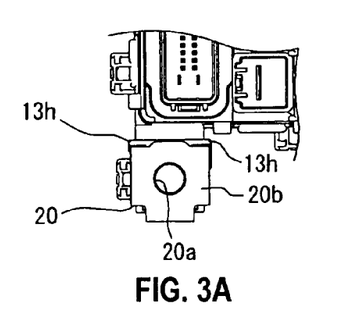
FIG. 3A is a plan view of a bracket section and a bracket, illustrating the bracket fitted on an exterior of the bracket section.
Figure 3B:
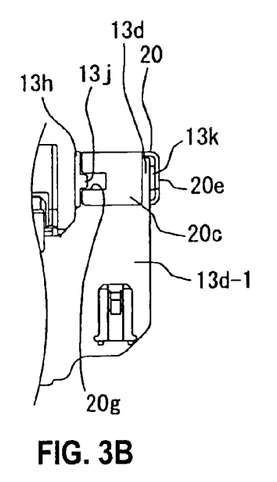
FIG. 3B is a left side elevation view of FIG. 3A.
Figure 3C:
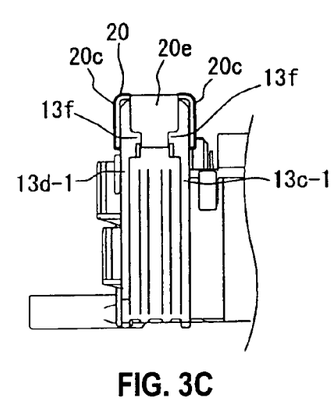
FIG. 3C is a front elevation view of FIG. 3A.

An electrical junction box 10 for a motor vehicle contains a circuit body in a casing assembly including an upper casing 11 and a lower casing 12. The upper and lower casings can be made of resin materials, for example. As shown in FIG. 4, a bracket section 13 for securing the electrical junction box 10 to a vehicle body is integrally formed on an outer surface of a side wall of the lower casing 12 and extends upward. The bracket section 13 may be made out of the same resin material as the casings, for example. As shown in FIGS. 1 to 3, a bracket 20 is fitted on an exterior of the bracket section 13. The bracket 20 may be made out of metal, for example.

As shown in FIG. 4, the bracket section 13 is formed into a box-like configuration having an opening in a bottom surface and a supporting portion for the bracket 20 on a top end surface. The bracket section 13 includes a rectangular top wall 13b provided with a clip-engaging hole 13a, opposite side walls 13c and 13d that are contiguous with the opposite side walls of the top wall 13b, an outer side distal end wall 13e that is contiguous with outer end edges of the top wall 13b and the opposite side walls 13c and 13d. The opposite side walls 13c and 13d extend downward from the outer side distal end wall 13e. A pair of clamping-piece portions 13f are provided on inner surfaces of projection portions 13c-1 and 13d-1. The pair of clamping-piece portions 13f are opposed to each other and contiguous with a lower end of the outer side distal end wall 13e. As shown in FIG. 3E, a distal end surface on each of the pair of opposed clamping-piece portions 13f is formed into an inclination surface 13g that is inclined inward.

Positioning ribs 13h maintain contact with bracket 20 and project from the exterior of inner end edges of the opposite side walls 13c and 13d. The opposite side walls 13c and 13d are provided with positioning projections 13i and 13j that extend from the positioning ribs 13h toward the outer end edges of the opposite side walls 13c and 13d. An extending length of the first positioning projection 13i provided on the first side wall 13c is set to be greater than an extending length of the second positioning projection 13j provided on the second side wall 13d. By making the length of the first positioning projection 13i longer, when the bracket 20 is attached to the bracket section 13, the positioning projection 13i is initially inserted into a positioning groove 20g in the bracket 20 to guide the bracket 20 in an attaching direction. If the second shorter positioning projection 13j is at least one-third or so the length of the positioning groove 20g, it is possible to prevent the bracket from rattling. The second positioning projection 13j may be set to be the same length as that of the positioning groove 20g in the bracket 20, as is the case with the first positioning projection 13i.

The outer side distal end wall 13e includes three ribs 13k that extend in a vertical direction and are disposed in a parallel orientation with one another.

As shown in FIG. 5, the bracket 20 to be fitted on the exterior of the bracket section 13, is formed, for example, by punching out a metal sheet into a desired shape and bending the punched sheet. The bracket 20 includes a top plate portion 20b adapted to be superimposed on the top surface of the top wall 13b of the bracket section 13 and provided with a clip-engaging hole 20a that communicates with the clip-engaging hole 13a, opposite side plate portions 20c extending downward from the opposite side edges of the top plate portion 20b and are superimposed on the exteriors of the opposite side walls 13c and 13d of the bracket section 13, and a substantially U-shaped and leaf-spring-like outer plate portion 20e extending downward from an outer end of the top plate portion 20b and bending inward at a lower end. The opposite side plate portions 20c and outer plate portion 20e are connected to the top plate portion 20b, respectively, while the opposite side plate portions 20c and the outer plate portion 20e are separated from each other.

Figure 5A:
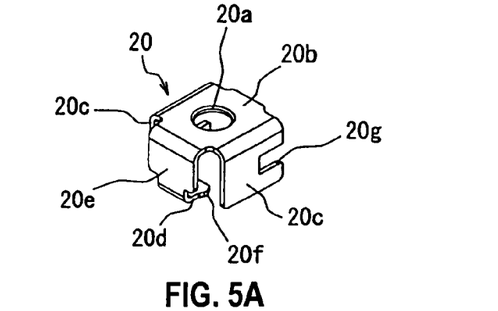
FIG. 5A is a perspective view of the bracket.
Figure 5B:
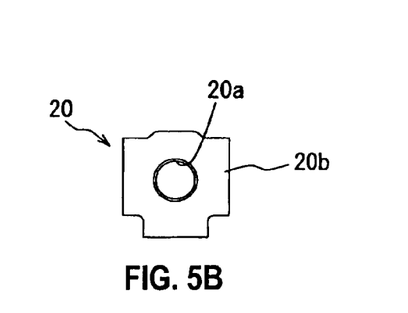
FIG. 5B is a plan view of FIG. 5A.
Figure 5C:
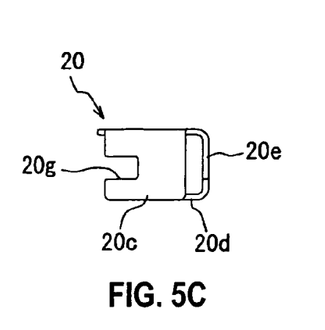
FIG. 5C is a left side elevation view of FIG. 5A.
Figure 5D:
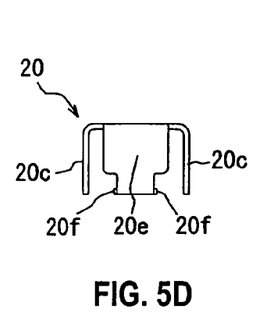
FIG. 5D is front elevation view of FIG. 5A.
Figure 5E:
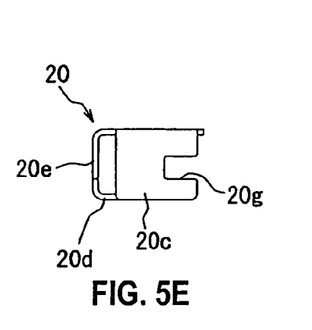
FIG. 5E is a right side elevation view of FIG. 5A.
Figure 5F:
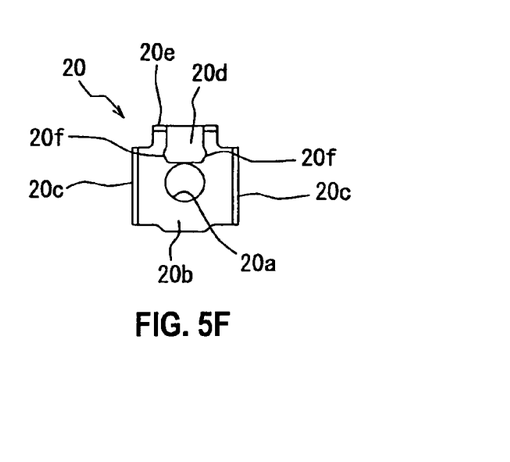
FIG. 5F is a bottom view of FIG. 5A.

As shown in FIG. 5F, a width of an engaging-piece portion 20d of the outer plate portion 20e is narrower than of the width of the downward extending portion of the outer plate portion 20e The engaging-piece portion 20d is provided on each of the opposite side end surfaces of the inner distal end with triangular pushing projections 20f. Each of the opposite side plate portions 20c are provided on an inner end with the positioning groove 20g that engages with each of the positioning projections 13i and 13j of the bracket section 13.

The bracket 20 is attached to the bracket section 13 while sliding on the resin bracket section 13 from the outer end side.

Specifically, the bracket 20 is slid onto the bracket section 13 while the top plate portion 20b and opposite side plate portions 20c of the bracket 20 are moved along the upper surface of the top wall 13b and the exterior of the opposite side walls 13c and 13d of the bracket section 13. The positioning projection 13i of the bracket section 13 is inserted into the first positioning groove 20g in the bracket 20 and the bracket 20 is guided in the attaching direction. As the bracket 20 slides onto the bracket section 13, the second positioning projection 13j of the bracket section 13 is inserted into the second positioning groove 20g in the bracket 20.

The engaging-piece portion 20d of the bracket 20 is inserted into a space between the clamping-piece portions 13f of the bracket section 13. The pushing projections 20f provided on the opposite side end surfaces of the engaging-piece portion 20d of the bracket 20 pushes the clamping-piece portions 13f of the bracket section 13. A click sound is generated, once the pushing projections 20f of the engaging-piece portion 20d climb over the clamping-piece portions 13f, thereby producing a feeling of adjustment upon insertion of the bracket 20.

At this time, as shown in FIG. 3E, the opposite side end surfaces of the engaging-piece portion 20d are clamped between and secured to the pair of clamping-piece portions 13f. The pushing projections 20f are engaged with the inner surfaces of the clamping-piece portions 13f. Thus, the bracket 20 is positioned on and secured to the bracket section 13.

As shown in FIG. 1, the inner surface on the downward extending portion of the outer side plate portion 20e of the bracket 20 maintains contact with the exteriors of the ribs 13k of the outer distal end wall 13e of the bracket section 13, while the engaging-piece portion 20d of the bracket 20 maintains contact with the lower end surface of the outer side distal end wall 13e of the bracket section 13.

Figure 3D:
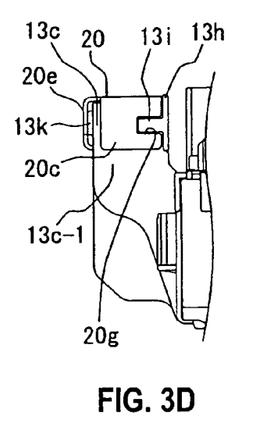
FIG. 3D is a right side elevation view of FIG. 3A.
Figure 3E:
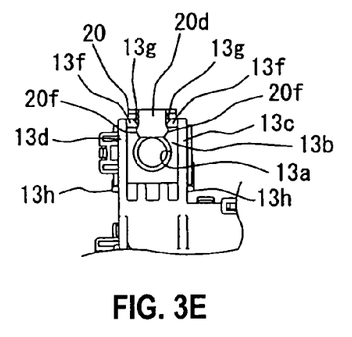
FIG. 3E is a bottom view of FIG. 3A.
Figure 4:
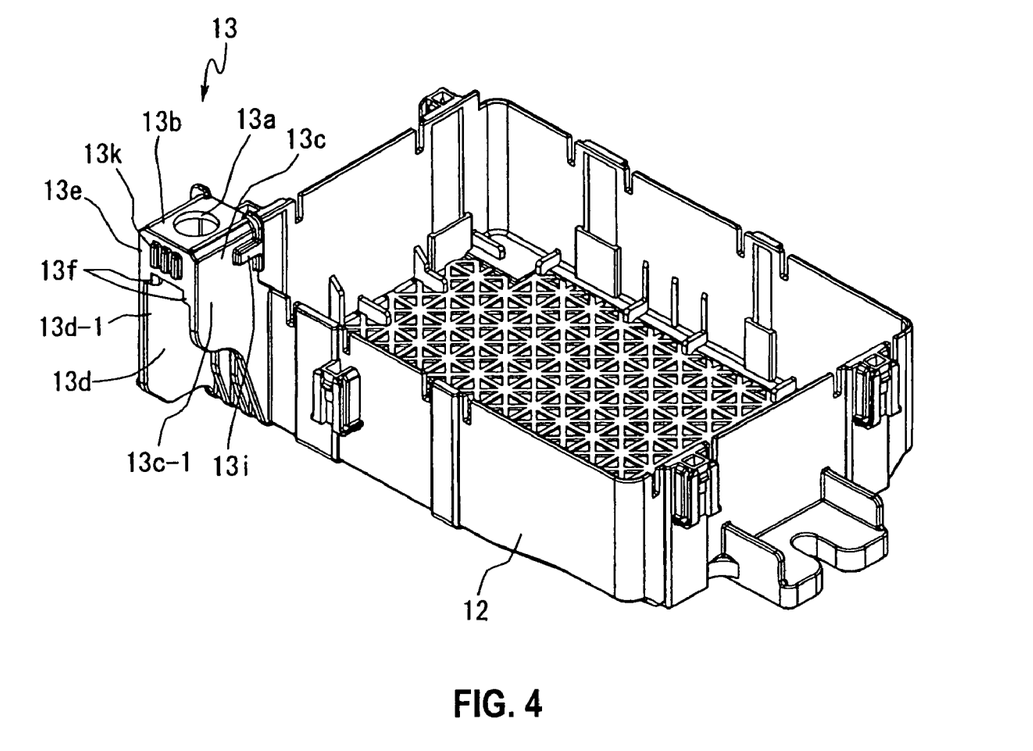
FIG. 4 is a perspective view of a lower casing of an electrical junction box.

As shown in FIG. 3D, the upper and lower end surfaces and the outer end surface of the positioning projection 13i provided on the first side wall 13c of the bracket section 13 maintain contact with the end edge of the positioning groove 20g in the bracket 20. On the other hand, as shown in FIG. 3B, only the upper and lower end surfaces of the positioning projection 13j provided on the second side wall 13d of the bracket section 13 maintain contact with the upper and lower edges of the positioning groove 20g in the bracket 20. The positioning of the positioning projection 13j relative to the positioning groove 20 defines a space of separation between the outer end surface of the positioning projection 13j and the end edge of the positioning groove 20g.

As shown in FIG. 1, a clip-attaching portion 41 having a clip-attaching hole 41a is provided on the trim cover 40 of the vehicle body for supporting the electrical junction box 10. In order to attach a clip 30 to the clip-attaching portion 41, a fitting groove 30b that is formed around a vehicle body fixing portion 30a on an end of the clip 30 that receives a peripheral part defining the clip-attaching hole 41a in the clip attaching portion 41, and an engaging portion 30c on the other end of the clip 30 that extends over the clip-attaching portion 41. The engaging portion 30c has opposite side wing portions 30e extending from the distal end of a shaft portion 30d.

When the electrical junction box 10 is secured to the vehicle body, as shown in FIG. 1, the engaging portion 30c of the clip 30 that projects from the trim cover of the vehicle body is inserted into the engaging hole 13a of the bracket section 13 and the clip-engaging hole 20a of the bracket 20, and the opposite side wing portions 30e of the vehicle body engaging portion 30c are engaged with the peripheral edge of the clip-engaging hole 13a.

Figure 6:
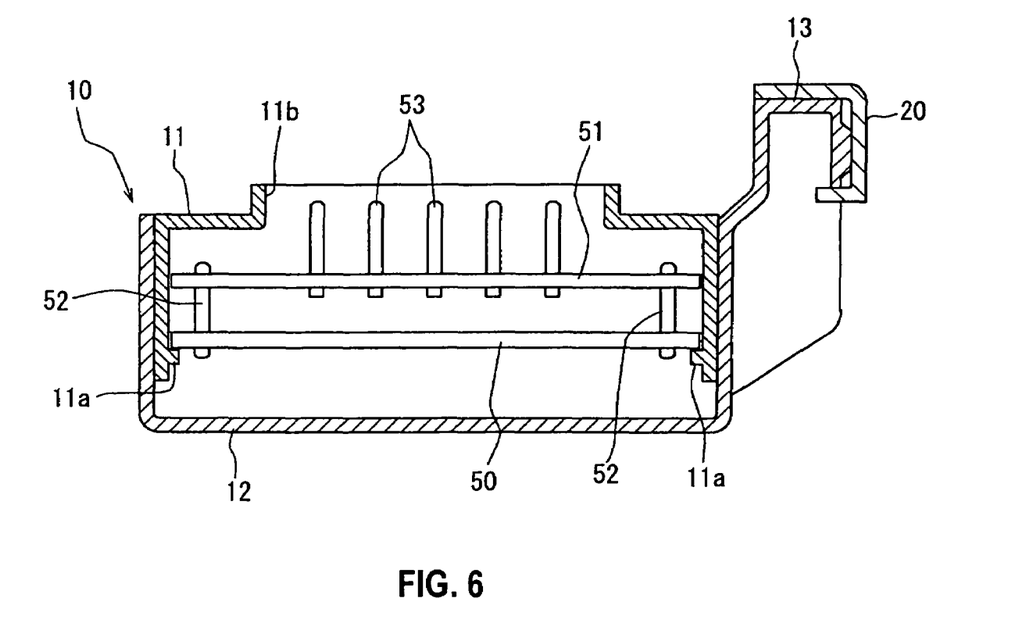
FIG. 6 is a schematic section view of an electrical junction box.

As shown in FIG. 6, printed boards 50 and 51 constitute a circuit body to be contained in the casing assembly having the upper and lower casings 11 and 12 locked on each other. The printed boards 50 and 51 are disposed on ribs 11a provided on an inner surface of the upper casing 11 and fixed on the upper casing 11. On the other hand, the bracket section 13 is provided on the side wall of the lower casing 12 on which the printed boards 50 and 51 are not fixed.

Pin-like terminal materials 52 are soldered on conductors of the printed boards 50 and 51 to connect the conductors of the printed boards 50 and 51 to each other through the terminal materials 52. Pin-like terminal materials 53 soldered on the conductor of the print board 51 and project into a connector-containing section 11b provided on an upper surface of the upper casing 11.

The upper casing 11 contains circuit body laminating insulation plates and bus bars that are formed by punching out a conductive metal sheet into a desired shape, although the circuit body is omitted from FIG. 6. A tab-like terminal is formed by bending the bus bar upward. The tab-like terminal projects into the connector-containing section 11b or a fuse-containing section 11c.

According to the above construction, the bracket 20 is fitted on and secured to the exterior of the bracket section 13, which is projected from the lower casing 12 of the electrical junction box 10, and the clip 30 attached to the trim cover 40 of the vehicle body is engaged with the bracket section 13 and the bracket 20 to secure the electrical junction box 10 to the vehicle body. Consequently, it is not necessary to extend the bracket 20 from the fixing position on the trim cover 40 of the vehicle body to the engaging position on the electrical junction box 10, thereby downsizing the bracket 20 and lowering the cost.

Furthermore, since the bracket 20 is fitted on the exterior of the bracket section 13 and the electrical junction box 10 is fixed through the clip 30 onto the trim cover 40 of the vehicle body, without locking and fixing the electrical junction box 10 on the bracket attached to the vehicle body, it is possible to secure the electrical junction box 10 to the trim cover 40 of the vehicle body without rattling.

Furthermore, since the bracket 20 is fitted on and secured to the exterior of the bracket section 13, it is possible to enhance the strength of the bracket section 13 and prevent the electrical junction box 10 from falling down and out of the vehicle body due to breakage of the bracket section 13.

When the bracket 20 is attached to the bracket section 13, the positioning projection 13i of the bracket section 13 is inserted into the positioning groove 20g in the bracket 20 to guide the bracket 20. When the pushing projections 20f of the engaging-piece portion 20d climb over the clamping-piece portions 13f, a locking sound will be generated to obtain a feeling of adjustment, thereby efficiently attaching the bracket 20 to the bracket section 13.

The pushing projections 20f of the bracket 20 are engaged with the clamping-piece portions 13f of the bracket section 13. The positioning grooves 20g in the bracket 20 are engaged with the positioning projections 13i and 13j on the bracket section 13. Consequently, it is possible to prevent the bracket 20 from shifting with respect to the bracket section 13 or falling off of the bracket section 13. Thus, when the clip 30 is inserted into the bracket 20 and the bracket section 13, the clip-engaging holes 20a and 13a in the bracket 20 and bracket section 13 are communicated with each other and they are not shifted from each other, thereby facilitating the clip 30 insertion and working engagement.

Moreover, since the printed boards 50 and 51 are not fixed to the lower casing 12 provided with the bracket section 13, but instead are fixed on the upper casing 11, a load applied to the bracket section 13 does not act directly on the printed boards 50 and 51. Thus, it is possible to prevent strain on the printed boards 50 and 51.

Figure 7:
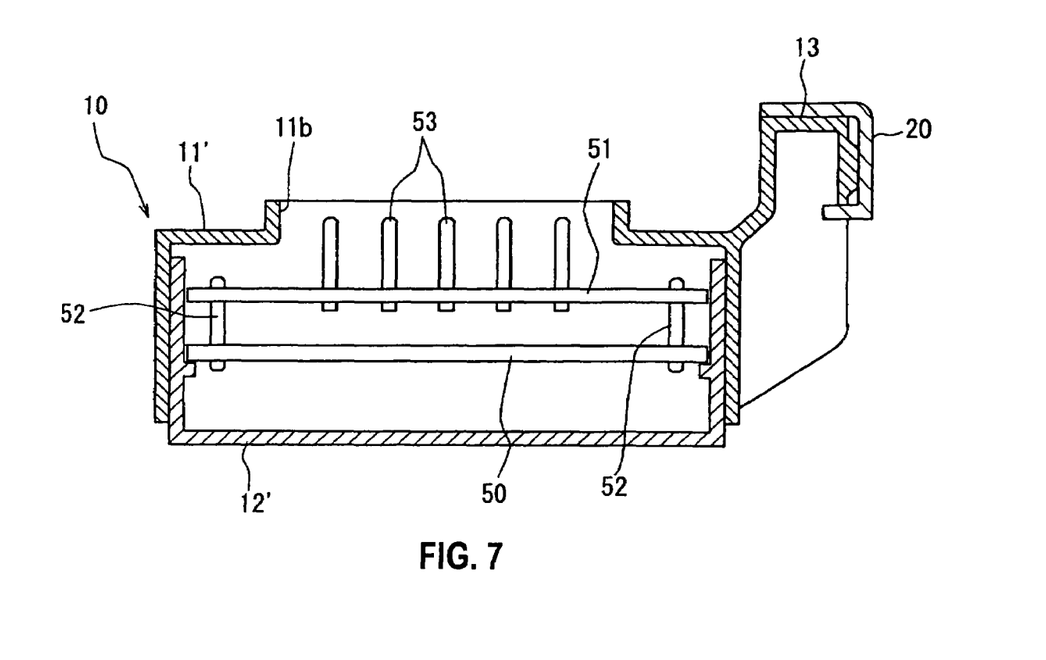
FIG. 7 is a schematic section view of a second embodiment of an electrical junction box.

FIG. 7 illustrates a second embodiment of the electrical junction box 10.

In the second embodiment, the printed boards 50 and 51 are fixed to the lower casing 12' while the bracket section 13 projects from the exterior of the side wall of an upper casing 11' on which the printed boards 50 and 51 are not fixed.

Since the other structures and operational effects of the modified example are the same as those in the first embodiment, explanations about the same components are omitted merely by giving the same reference numbers or sings to them.

What is claimed is:

1. An electrical junction box for a motor vehicle, the electrical junction box comprising:
   a casing assembly;
   a bracket section that is integrated with and projected from an exterior of the casing assembly, the bracket section includes:
      a top wall provided with a clip-engaging hole; and
      opposite side walls extending downward from the top wall and that have clamping-piece portions that are opposed to each other; and
   a bracket that is fitted on and secured to an exterior of the bracket section, the bracket includes:
      a top plate portion provided with a clip-engaging hole; and
      an outer plate portion extending downward from the top plate portion and that has an engaging-piece portion;
   wherein the engaging-piece portion of the bracket clamps to the opposed clamping-piece portions of the bracket section and secures the bracket to the bracket section such that the clip-engaging hole of the bracket section and the clip engaging hole of the bracket align with one another, and
   wherein an engaging-clip is inserted into and engaged with the clip-engaging holes aligned with each other.

2. The electrical junction box for the motor vehicle according to claim 1, wherein:
   the opposite side walls of the bracket section are contiguous to opposite side edges of the top wall; and
   an outer side distal end wall is contiguous to an outer end edge of the top wall, the opposite side walls extending downward from the outer side distal end wall.

3. The electrical junction box for the motor vehicle according to claim 2, wherein the bracket further includes opposite side plate portions that extend downward from opposite side edges of the top plate portion.

4. The electrical junction box for the motor vehicle according to claim 3, wherein pushing projections are provided on opposite side end surfaces of the engaging-piece portion of the bracket to press the clamping-piece portions of the bracket section.

5. The electrical junction box for the motor vehicle according to claim 4, wherein:
   the opposite side walls of the bracket section include first and second positioning projections;
   the first positioning projection is longer than the second positioning projection;
   the opposite side plate portions of the bracket include positioning grooves; and
   the positioning grooves of the bracket guide the first and second positioning projections of the bracket section to help align and securely fix the bracket to the bracket section.

6. The electrical junction box for the motor vehicle according to claim 5, wherein:
   the bracket section is provided on an upper casing or a lower casing of the casing assembly; and
   a board is attached to the upper casing or the lower casing, whichever does not provide for the bracket section.

7. The electrical junction box for the motor vehicle according to claim 6, wherein the bracket section has a box configuration with an opening at a bottom surface, and the top wall of the bracket section is rectangular.

8. The electrical junction box for the motor vehicle according to claim 7, wherein when the bracket section and the bracket are clamped together, the top plate portion of the bracket is superimposed on an upper surface of the top wall of the bracket section and the opposite side plate portions of the bracket are superimposed on opposite side surfaces of the opposite side walls of the bracket section.

9. The electrical junction box for the motor vehicle according to claim 8, wherein:
   the outer plate portion of the bracket extends downward from an outer end of the top plate portion;
   the engaging-piece portion of the outer plate portion has a lower end that is bent inward and opposite side end surfaces; and
   the outer plate portion is resilient.

10. The electrical junction box for the motor vehicle according to claim 9, wherein the engaging-piece portion of the bracket contacts with a lower end surface of the outer side distal end wall of the bracket section and the opposed clamping-portions of the bracket section clamp and secure the opposite side end surfaces of the engaging-piece portion in the bracket section.

11. The electrical junction box for the motor vehicle according to claim 1, wherein the bracket section is made of resin material.

12. The electrical junction box for the motor vehicle according to claim 6, wherein the casing assembly is made of resin material.

13. The electrical junction box for the motor vehicle according to claim 1, wherein the bracket is made of metal.

* * * * *